United States Patent
Fournel

(10) Patent No.: US 6,239,651 B1
(45) Date of Patent: May 29, 2001

(54) NEGATIVE LOAD PUMP DEVICE

(75) Inventor: Richard Fournel, Lumbin (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/221,224

(22) Filed: Dec. 23, 1998

(30) Foreign Application Priority Data

Dec. 24, 1997 (FR) .................................................. 97 16464

(51) Int. Cl.$^7$ ...................................................... G05F 1/10
(52) U.S. Cl. ............................................ 327/536; 327/537
(58) Field of Search ..................................... 327/536, 537, 327/589, 530, 534, 535, 538, 543, 544; 328/88

(56) References Cited

U.S. PATENT DOCUMENTS

| 4,585,954 | | 4/1986 | Hashimoto et al. | |
|---|---|---|---|---|
| 5,168,174 | * | 12/1992 | Naso et al. | 327/540 |
| 5,191,232 | | 3/1993 | Wang | 327/306 |
| 5,227,675 | * | 7/1993 | Taguchi | 327/530 |
| 5,266,842 | * | 11/1993 | Park | 327/534 |
| 5,347,171 | * | 9/1994 | Cordoba et al. | 327/536 |
| 5,394,365 | | 2/1995 | Tsukikawa | 365/189.89 |
| 5,399,928 | * | 3/1995 | Lin et al. | 327/434 |
| 5,489,870 | * | 2/1996 | Arakawa | 327/536 |
| 5,694,072 | | 12/1997 | Hsiao et al. | 327/537 |
| 5,754,476 | * | 5/1998 | Caser et al. | 365/185.29 |
| 5,774,012 | * | 6/1998 | Im | 327/536 |
| 5,838,190 | * | 11/1998 | Lee | 327/537 |
| 5,886,567 | * | 3/1999 | Park et al. | 327/537 |
| 5,892,267 | * | 4/1999 | Takada | 327/536 |
| 6,116,585 | * | 12/2000 | Bazzani | 327/536 |
| 6,121,821 | * | 12/2000 | Miki | 327/536 |

FOREIGN PATENT DOCUMENTS

| 0 319 063 A2 | 11/1988 | (EP) . | |
|---|---|---|---|
| 0 596 228 A1 | 9/1993 | (EP) . | |
| 0 609 497A2 | 10/1993 | (EP) . | |
| 0 638 984 A1 | 7/1994 | (EP) . | |
| 0 678 970 A2 | 4/1995 | (EP) . | |
| 0 813 290 A2 | 2/1997 | (EP) . | |
| 0 800 212 A2 | 4/1997 | (EP) . | |
| 0 822 477 A2 | 7/1997 | (EP) . | |
| 2 035 629 | 6/1980 | (GB) | G05F/1/46 |
| 89/05545 | 6/1989 | (WO) . | |
| 96/28877 | 9/1996 | (WO) . | |

* cited by examiner

Primary Examiner—Kenneth B. Wells
Assistant Examiner—Hai L. Nguyen
(74) Attorney, Agent, or Firm—Theodore E. Galanthay; Allen, Dyer, Doppelt, Milbrath & Gilchrist, P.A.

(57) ABSTRACT

A negative load pump circuit includes switching MOS transistors and capacitors. Each switching transistor is formed in a well on an integrated circuit, and each transistor has its well contact or body connected to its gate and to its source to receive a phase signal. The device advantageously includes a circuit for the regulation of the negative load pump circuit. This maintains the negative load pump circuit in stopped conditions corresponding to minimum power consumption, and enables a speedy supply of a negative low level expected at the output of the negative load pump circuit for an intended application. This is based upon activation by an external command.

33 Claims, 11 Drawing Sheets

NEGATIVE LOAD PUMP DEVICE

FIELD OF THE INVENTION

The present invention relates to the field of integrated circuits, and, more particularly, to a device for the generation of a negative voltage level.

BACKGROUND OF THE INVENTION

There is a trend towards the reduction of supply voltage levels in integrated circuits, especially to reduce their electrical power consumption. This forces integrated circuit designers to develop appropriate technologies to reduce the levels of the threshold voltages of transistors for these transistors to operate in a sufficiently reliable manner at a lower supply voltage. This is done while maintaining or even improving the speed of operation. However, the technology used imposes limits. In one example, reference is made to 0.25 micron CMOS technology. To obtain low threshold voltages for the transistors, the nominal values $|Vtp|=475$ millivolts for a P-type transistor and $Vtn=469$ microvolts for an N-type transistor, require a total voltage of about 900 millivolts. Accordingly, there is some difficulty in operating such a device at a logic supply voltage of 1 volt or less using 0.25 micron technology.

One way of operating an integrated circuit at a low voltage or a very low voltage is to modify the characteristics of certain transistors on critical conduction paths. For this purpose, a negative voltage can be applied where a zero voltage is commonly used. In the invention, it is sought, more particularly, to switch over the zero voltages using P-type MOS transistors connected to a load line. A load line, for example, is connected to a row of dynamic memory cells.

In an example of this kind, to store a 0 in the row, a row decoder commonly switches to ground Gnd. As a first approximation, and overlooking the substrate effect, the level Gnd - Vtp is present on the row. In practice, several hundreds of millivolts are measured. If the supply voltage decreases, the operating window of the read circuit becomes too small. The period of retention in the memory thus becomes greatly reduced. The switching needs to be carried out using the most negative possible voltage. The negative voltage must be within the limit of voltages that are acceptable and compatible with known standards for achieving reliable components for the technologies used. As a result, the window of operation would be widened.

In one example using a dynamic memory, the negative voltage is to be applied to a large load, such as the row of memory cells. A negative load pump device is therefore used to provide a negative voltage at output. There are known negative load pump devices used in combination with row decoders. U.S. Pat. No. 5,168,174 describes a device of this kind. However, there are high negative voltage levels, e.g., in the range of −11 volts, used for the electrical erasure of non-volatile memories. However, these operating devices do not work at low voltages.

SUMMARY OF THE INVENTION

The present invention provides a load pump device capable of providing a negative voltage when supplied with a low voltage of 1 volt or less. The negative voltage provided can range from several hundreds of millivolts to a few volts with sufficient energy. The invention can be applied especially to integrated circuits made by MOS, CMOS or BiCMOS technology supplied with low voltage, particularly to dynamic memories.

One approach is to provide an integrated circuit device that includes a negative load pump circuit having switching MOS transistors and capacitors. According to the invention, the switching transistors are each formed in a well on the integrated circuit, and each transistor has its well contact or body connected in common to its gate and to its source to receive a phase signal. This device may have only one stage for obtaining a negative output voltage of about −1 volt from a 1-volt supply voltage Vdd.

The negative load pump device includes a pump stage with a capacitor and a switching transistor having its drain connected to the first terminal of the capacitor. The negative load pump device further includes a first inverter and a second inverter series-connected to respectively provide a first phase signal and a second phase signal from a clock signal applied to the input of the device. The first phase signal is applied to the gate of the switching transistor and the second phase signal is applied to the second terminal of the capacitor. The output of the negative load pump device is supplied by the first terminal of the capacitor. If a more negative voltage is sought at output of the pump stage, it is necessary to provide several stages.

A first embodiment of a negative load pump device with several stages according to the invention comprises only two inverters, regardless of the number of stages of the pump. The two phase signals needed for the first stage are obtained from the two inverters. One of the two phase signals needed for the following stages is generated by the previous stage.

A second embodiment of the invention comprises one inverter per stage in addition to a first inverter. This device is advantageous with respect to the stability of the output level and the efficiency of the negative load pump device, but takes up more space since there is one additional inverter per stage. Either of these devices can be selected depending on the intended application.

In another embodiment, the negative load pump device according to the invention is advantageously combined with a regulation circuit to limit the power consumption of the device when it is not used. At the same time, the supply of the negative level expected at the output is enabled on the basis of its stopping conditions, with a very short response time.

Preferably, the regulation circuit is controlled by the voltage level at output of the next to the last stage. When this level is more negative than a defined threshold, and if the pump is not activated by an external command, the pump is stopped. The voltage at the last stage is then at a high standby level. It is possible to generate the negative voltage level expected at the output at the next change in clock phase, i.e., when the clock signal is transmitted again.

Under these stopping conditions the voltage level at the last stage is closest to zero. The power consumption and leakage currents are reduced to a minimum as is the voltage stress on the transistors to which the output voltage VF of the pump is supplied. The threshold used for the comparison of the voltage level of the next to the last stage is defined to have a high standby level on the last stage. This makes it possible to obtain the negative low level at the output that is expected for the intended application. The regulation according to the invention therefore makes it possible to ensure the supply of the negative level at the output on demand.

Furthermore, on the basis of the stopping conditions, if the negative load or charge pump device is reactivated by an external command, the change in phase following the clock signal is enough to provide the negative level desired at the output for the intended application. The response time of the charge pump is thus optimum. When there is no external activation command, the pump is stopped as long as the stopping conditions are detected. This is, as long as the level on the next to the last stage is sufficiently negative and above the threshold. If this level increases due to inevitable leakages, the pump is again activated to provide a more negative level.

In another embodiment that is applicable when the negative load pump device has only one stage, the regulation circuit makes direct use of the output level VF of the pump. The regulation circuit can also be used when the pump has more than one stage. In this case, the same stopping conditions are present. It is necessary to stop the pump at the high level of the signal VF when this high level becomes smaller than a specified threshold. Here, the detection includes making a direct comparison of the voltage level VF of the last stage with this threshold. This is necessary, in addition to sampling the result of this detection, to take into account only the detection on the high level and overlook the detection on the low level of the signal VF. The threshold is defined to obtain the desired negative level at the output for the intended application based on next phase change of the clock signal. In other words, as soon as the high level becomes sufficiently negative to enable the generation of a sufficiently low negative level at the next phase change for the intended application, the pump is stopped. The pump remains stopped as long as the conditions are met.

The regulation circuit in the first or second embodiment is not limited to its application to a negative load pump. It is generally applicable to all prior art negative load pumps to improve power consumption, and, at the same time ensure a highly efficient response time. The pump provides a more negative level than the one expected for the application. It is the defining of the regulation threshold that makes it possible to ensure the negative low level expected at the output for a given application. Finally, it is possible to use a command for placing the pump on standby. This is applied to the comparison circuit to prevent it from functioning and therefore consuming power. This is also applied to the logic circuit to prevent the transmission of the clock signal to the pump. Application is made directly or indirectly by using the output of the comparison circuit.

A negative load pump device according to the invention can advantageously be combined with a circuit for the generation of a square wave voltage between the supply voltage level Vdd and a negative level. The negative level ranges from minus several hundreds of millivolts to −Vdd, to control a circuit for switching the negative voltage. This makes it possible to switch over the maximum of this negative voltage to a load. The entire device according to the invention, with the pump circuit, the regulation circuit, and the circuit for generating a square wave is particularly suited to a low voltage supply of 1 volt or less for the integrated circuit.

BRIEF DESCRIPTION OF THE DRAWINGS

Other features and advantages of the invention are presented in the following description, given by way of an indication that in no way restricts the scope of the invention, made with reference to the appended figures, of which.

DETAILED DESCRIPTION OF THE PREFERRED EMBODIMENTS

The following description relates to an integrated circuit made with MOS transistors on a P-type substrate. The transistors receive supply voltages that are the positive logic supply voltage Vdd and ground Gnd. The same reference is used to designate the voltage level and the signal itself. The same elements in the figures have the same references.

Figure 1:
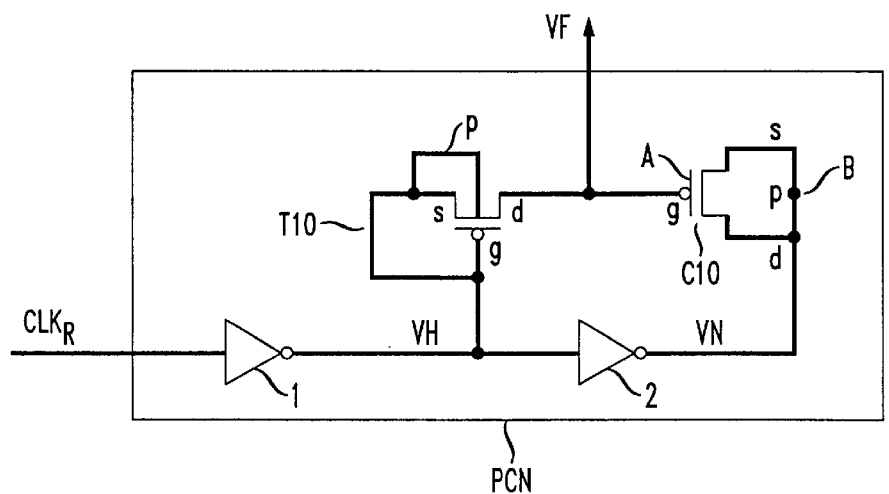
FIG. 1 shows a drawing of a single-stage negative load pump device, according to the present invention.

FIG. 1 shows a device comprising a negative load pump PCN according to the invention. This negative load pump PCN is capable of supplying a negative voltage VF to a large load. This pump circuit can be used, for example, to apply a stable negative voltage with efficient response times to a row of cells of a dynamic memory. Load pump circuits are well known to one skilled in the art. They include arrangements of switching transistors, diodes and capacitors sequenced by two clock signals in opposing phase.

The load pump circuit according to the invention includes a structure of switching transistors and capacitors, in which each switching transistor is a MOS transistor formed in a well on an integrated circuit. The well contact or body of the transistor is connected together to its gate and its source to receive a clock signal. The drain is connected to one of the terminals of an associated capacitor. In the example, the MOS transistors are P-type transistors formed in an N-type well. It is also possible to have N-type transistors made in a P-type cell in an N well zone. This is known as the triple well technology.

The capacitors may be pure capacitors, but they are preferably MOS transistors. The drain and the source of the MOS transistor that form the capacitor are connected together to form one terminal of the capacitor with the gate forming the other terminal. In the example, they are P-type transistors formed in an N-type well. The body is preferably connected to the source and to the drain to prevent the parasitic capacitance effect observed when the body is connected to the supply voltage Vdd.

The negative load pump circuit PCN, according to the invention, has only one stage as shown in FIG. 1. The pump circuit receives an input control clock signal referenced CLKr. This signal is applied to a first inverter 1 that provides a first phase signal VH. This first phase signal VH is applied to a second inverter 2 that provides a second phase signal VN in an opposing phase to the first signal. These two phase signals are applied to the first stage of the pump. The pump comprises a switching transistor T10 and a capacitor C10.

In the example, the switching transistor is a P-type MOS transistor formed in a well. The gate g, the source s and the body are connected together and receive the first phase VH. The drain is connected to a first terminal A of the capacitor C10 whose second terminal B receives the second phase signal VN. This capacitor is a P-type MOS transistor formed in a well N, whose gate g is the first terminal A and whose source s, drain d and body are connected together to form the second terminal B. The output voltage VF is provided by the first terminal A of the capacitor. The capacitor should have a size capable of providing a sufficiently negative level at output of the pump.

It is possible, with a sufficiently sized single-stage load pump according to the invention, and with the use of a supply voltage Vdd of 1 volt, to provide an output negative voltage VF. The output negative voltage VF has a level that oscillates between a low level (the most negative level) of −1 volt and a high level (the least negative level) of +200 millivolts. The low level reached is sufficient for integrated circuits made according to certain technologies with low transistor threshold voltages. These technologies generally have a low oxide breakdown voltage. In the example of the 0.25 micron CMOS technology where |Vtp|=475 millivolts for a P-type transistor and Vtn=469 millivolts for an N type transistor, the breakdown voltage is about 2.75 volts. The difference between the level of Vdd and the negative level should not be greater than 2.75 volts. With a supply voltage Vdd of 1 volt, it is not reasonably possible to accept a voltage that is more negative than −1.5 volts. The approach of the invention with a single stage therefore corresponds to these requirements.

If standard MOS technology is used, the oxide breakdown voltage will be higher and so will the threshold voltages of the transistor. In this case, it is necessary to use a more negative voltage. It is therefore necessary to provide a pump circuit comprising several stages. At least two stages are required.

Figure 2:
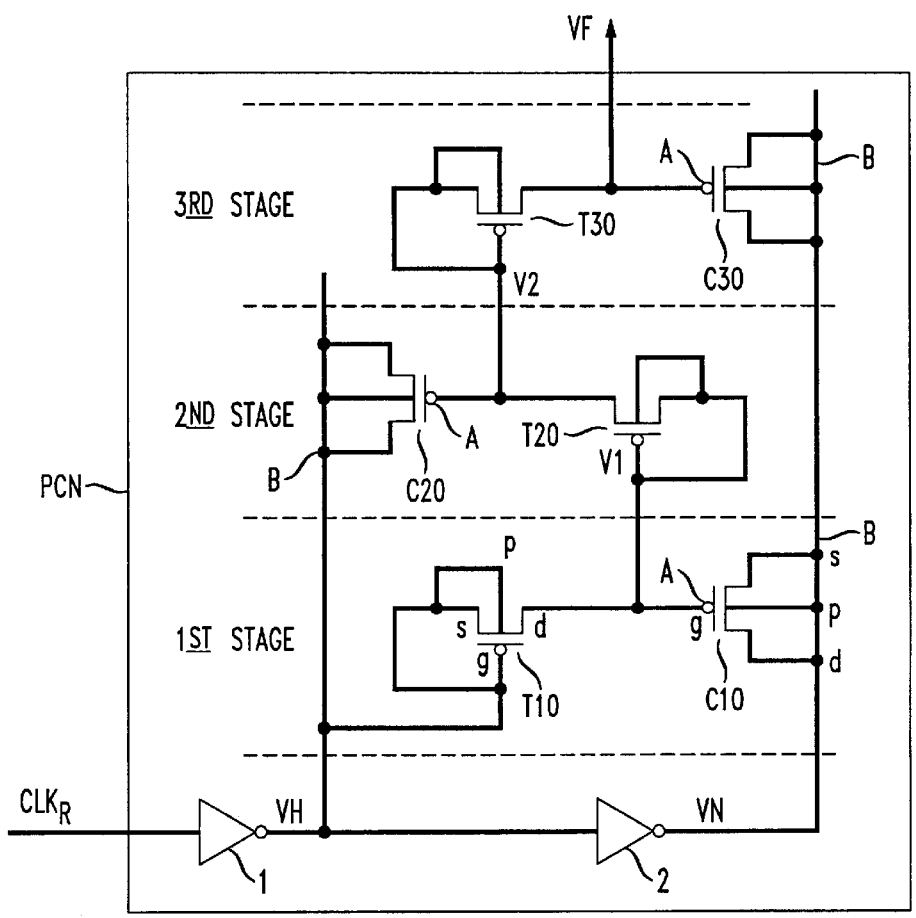
FIG. 2 shows a negative load pump device with several stages, according to a first embodiment of the present invention.

A first embodiment of a negative load pump circuit PCN according to the invention comprises several stages, as shown in FIG. 2. In the example, three stages are shown. The number of stages illustrated in the example is not a limitation to the other possible number of stages that can be used. For example, there could be two or four stages, depending on the negative voltage level to be provided at the output.

The first stage is identical to that of FIG. 1 and uses the two inverters 1 and 2 to provide the phase signals VH and VN. The terminal A of the capacitor C10 provides a voltage signal referenced V1. The second stage comprises a switching transistor T20 and a capacitor C20. They each have the same structure as in the first stage. That is, the switching transistor T20 has its gate g, its body p and its source s connected together while its drain is connected to the terminal A of the capacitor C20. This switching transistor is controlled at the gate g by a phase signal that is the voltage signal V1 provided by the first stage. This is done while the terminal B of the capacitor C20 receives the phase signal VH. The terminal A of the capacitor C20 provides the output voltage signal of the second stage, referenced V2. The third stage comprises a switching transistor T30 and a capacitor C30 having the same structure as above. The transistor T30 is controlled at its gate by a phase signal which is the voltage signal V2 provided by the second stage, i.e., the previous stage, while terminal B of the capacitor C30 receives the phase signal VN. The last stage, which is the third stage, provides the output signal of the pump referenced VF.

In short, this first embodiment is such that the switching transistors T20, T30 of each of the stages following the first stage is controlled at its gate by the output signals V1, V2 of the previous stage. Terminal B of the capacitor of the even-order stages C20 is controlled by the first phase signal VH. The terminal B of the capacitors of the odd-order stages C10, C30 are controlled by the second phase signal VN.

Figure 3:
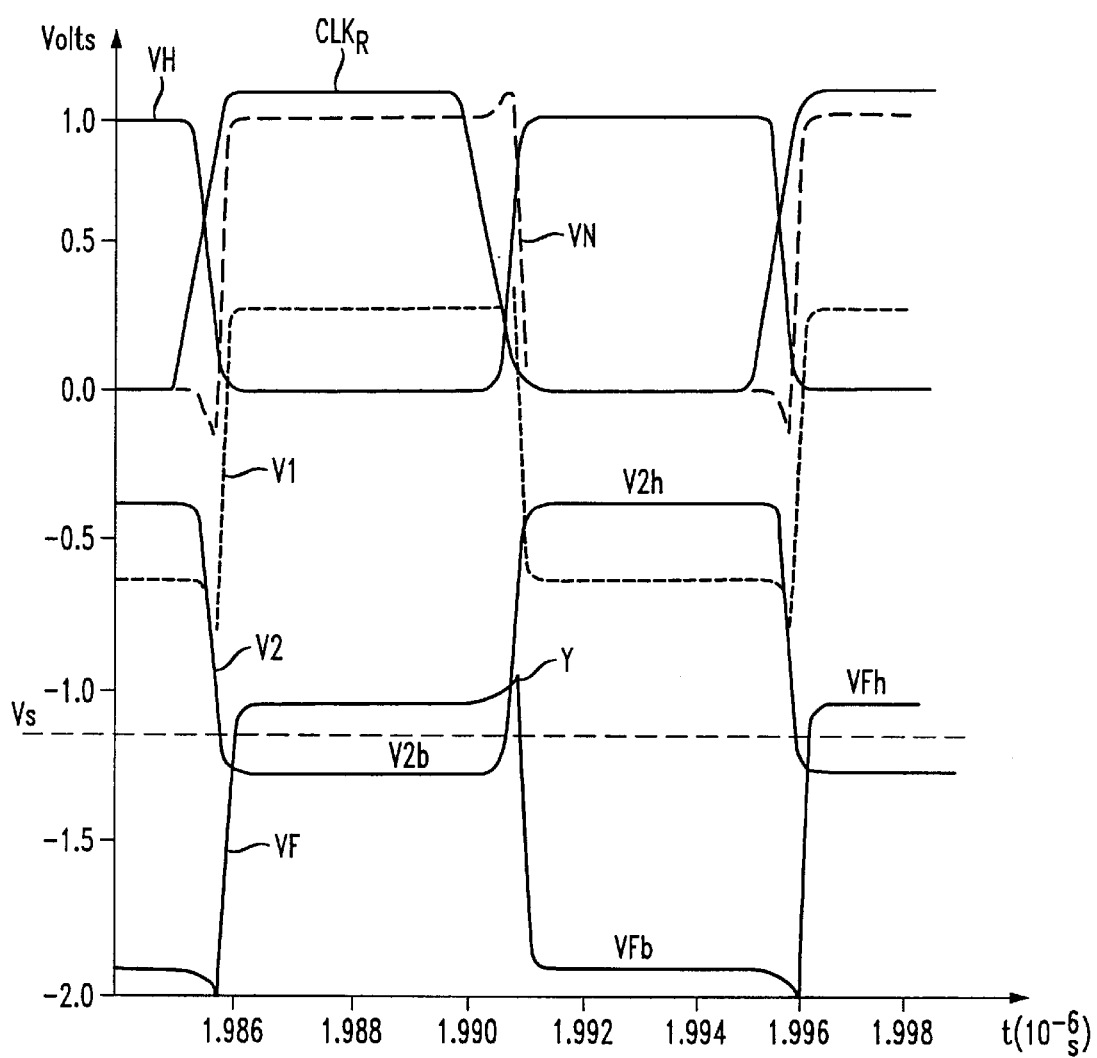
FIG. 3 shows the changes of the different voltage signals in the device of FIG. 2.

Operation of the pump is straight forward and is illustrated in FIG. 3, which shows the different signals VH, VN, V1, V2, VH and CLKr. When the first phase signal VH is at 0 and the second phase signal VN is at 1, the capacitor C10 is charged. This draws V1 towards 1. When VH goes back to 1, the charging is stopped and the changing of VN to 0 pushes V1 below zero. This is found at each stage. Signals V1 and VH are in opposing phase for the second stage. Signals V2 and Vn are in phase for the third stage.

According to FIG. 3, the output signal VF can also go from a high level of −1 volt (least negative level) to a low level of −2 volts (most negative level) using a supply voltage Vdd of 1 volt. This result is achieved for three pump stages. This is highly satisfactory. However, a small voltage peak is observed at VF, as well as at V1, at the time of the transitions. These peaks are due to the fact that the first phase signal VH rises or falls back before the second phase signal VN falls or rises. The phase signal VN is provided by the output of the inverter 2 from the phase signal VH.

Figure 4:
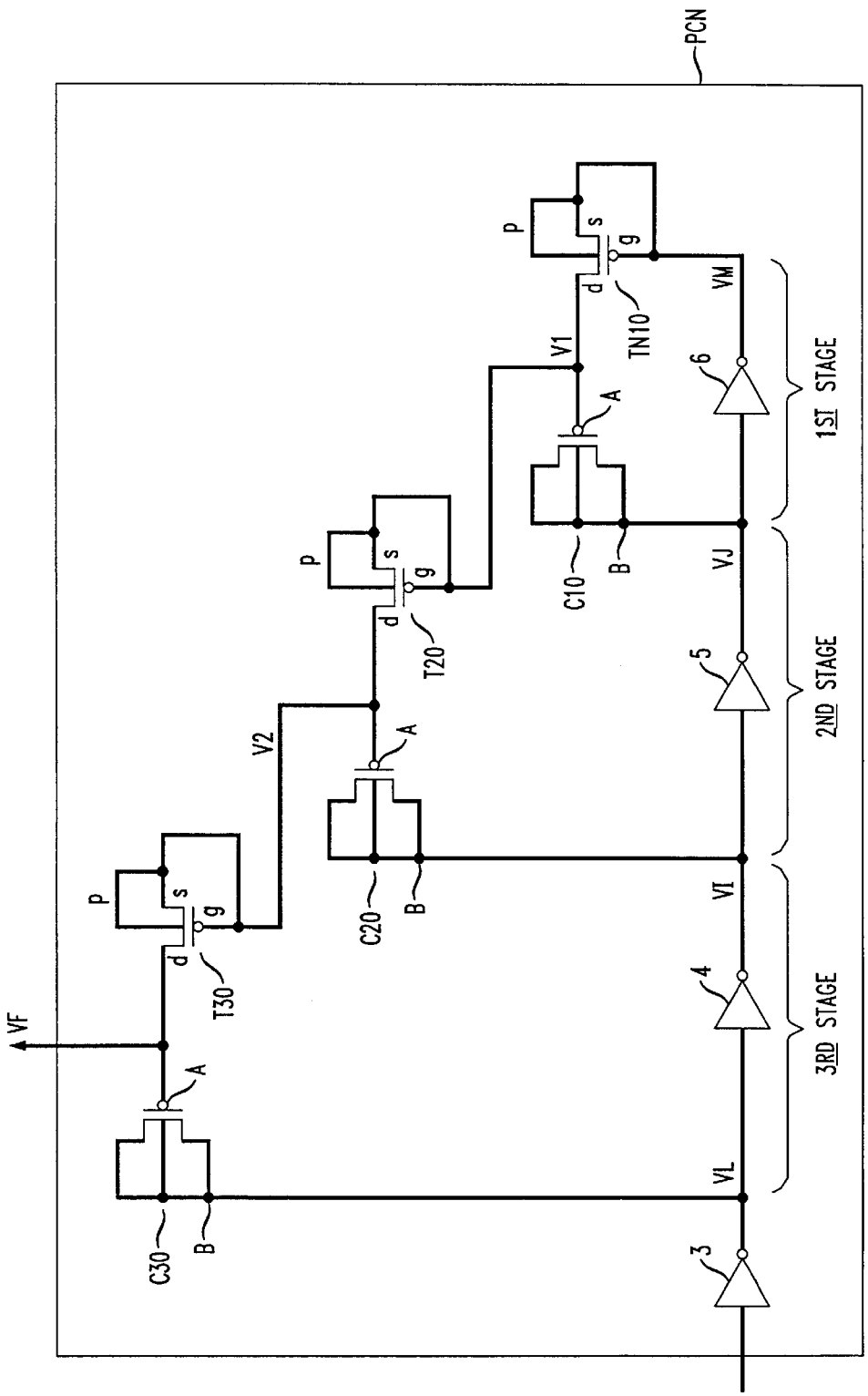
FIG. 4 shows a negative load pump device with several stages, according to a second embodiment of the present invention.

To overcome this drawback, a second embodiment of the invention is proposed, as illustrated in FIG. 4. In this second embodiment of the negative load pump circuit, the three previous stages are controlled differently. In the pump circuit according to the first embodiment shown in FIG. 2, the first phase signal VH is used to control the switching transistor of the first stage and the terminal B of the capacitor of all the even-order stages. This is done while the second phase signal VN is used to control the terminal B of the capacitor of all the odd-order stages.

In the second embodiment, there is one inverter per stage to provide an associated phase signal. Thus, in the example shown, there is a first inverter 3 which provides a first phase signal VL followed by a second inverter 4 which provides a second phase signal VI. This in turn is followed by a third inverter 5, which provides a third phase signal VJ, followed by a fourth and last inverter 6, which provides a fourth and last phase signal VM. The switching transistor T10 of the first stage is controlled by the last-phase signal VM, while the terminal B of the capacitor C10 receives the third phase signal VJ.

The transistor T20 of the second stage is controlled at its gate by a phase signal that is the output voltage signal of the first stage V1, while the terminal B of the capacitor C20 receives the second phase signal VI. The transistor T30 of the third and last stage is controlled by a phase signal. The phase signal is the output voltage signal V2 of the second and the next to last stage. The terminal B of the capacitor C30 receives the first phase signal VL.

In short, in an n-stage pump circuit according to this second embodiment, there is a sequence of n+1 series-connected inverters. The first inverter receives the clock signal CLKr from the pump, and provides the first phase signal VL to be applied to the terminal B of the capacitor of the last stage. The last inverter provides a last phase signal VM used to control the gate of the switching transistor T10 of the first stage. Each of the other inverters are connected between the terminal B of the capacitor of the following stage and the terminal B of the capacitor of the previous stage. Through this arrangement of the inverters, the charging and discharging sequence is appropriate. The output signals VF, V1 obtained are smooth without voltage peaks. However, this arrangement is obtained at a price, i.e., each stage of the pump requires one additional inverter.

Figure 5:
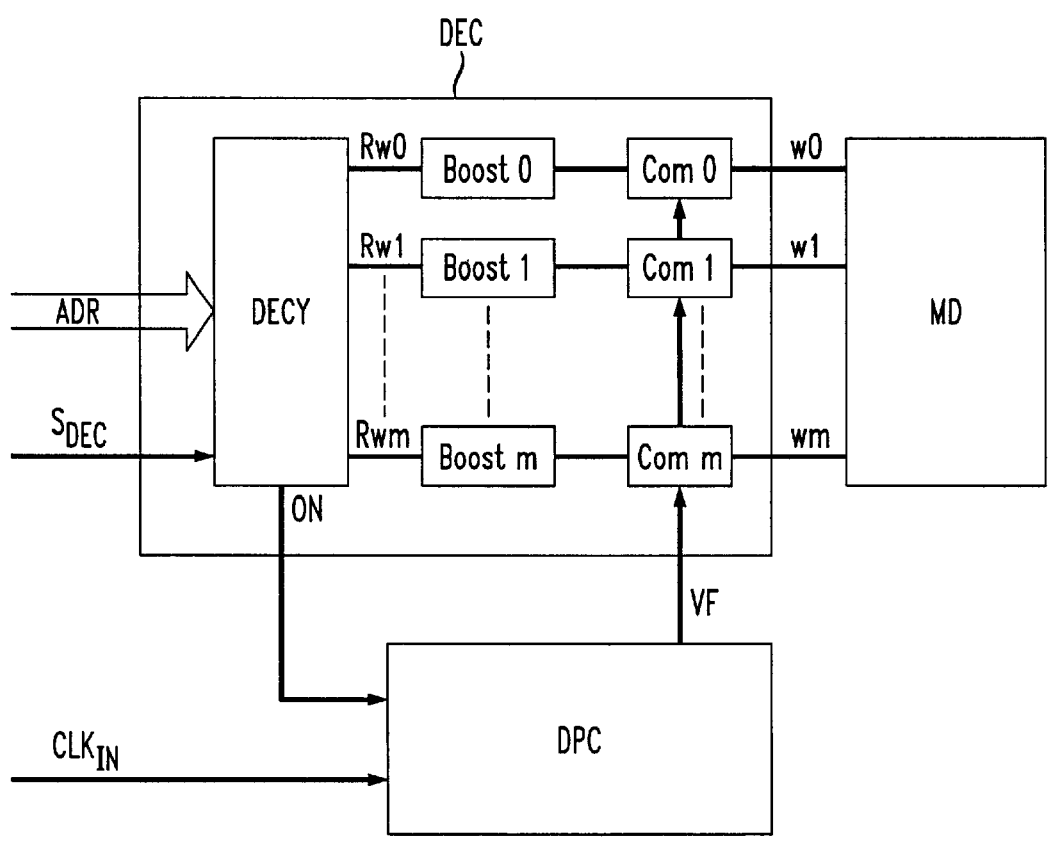
FIG. 5 is a block diagram of a device for switching a negative voltage, provided by a negative load pump device, to a row of memory cells in a dynamic memory integrated circuit, according to the present invention.

FIG. 5 shows a block diagram of a device for the switching of a negative voltage VF to a row of cells of a dynamic memory MD in an integrated circuit. A negative load pump device DPC is used according to the invention. The switching device has a memory address decoder DEC with a row address decoder DECY. This row address decoder DECY receives the address signals ADR and an activation signal Sdec synchronized with the clock signal CLKin. In response to the address signals, it provides an output signal for the selection of a row of cells of the dynamic memory MD. There is thus one selection signal RW0, RW1, . . . , RWn per row W0, W1, . . . , Wn of the memory. The row decoder DECY furthermore provides an output signal ON synchronized with the signal CLKin by the activation signal Sdec and is derived from the address signals. An activation of this signal ON indicates that a row address is or is going to be selected.

The selection of a row W0, for example, includes the transmission by the row decoder DECY a clock signal pulse CLKin at the corresponding selection signal RW0. The signal ON is applied as an external command to a negative load pump device DPC to control the supply of the low level (most negative level) of the output voltage VF to a selected row by the row decoder DECY. This is done to store a zero in the cells or in some cells of this row. The device DPC furthermore receives the clock signal CLKin used to sequence the pump. In practice, a synchronization is needed between the row decoder and the device DPC to provide the voltage VF at the right time. This is why the activation signal Sdec and an external control signal ON are synchronized with the clock signal CLKin of the device DPC.

To enable the switching of the negative level VF to a row, at the output of the row address decoder DECY and for each row W0, W1, . . . , Wm of the memory, there is a respective switching circuit Com0, Com1, . . . , Comm with an associated switching control circuit or booster circuit, Boost0, Boost1, . . . , Boostm to switch the negative level VF to a selected row.

Figure 6:
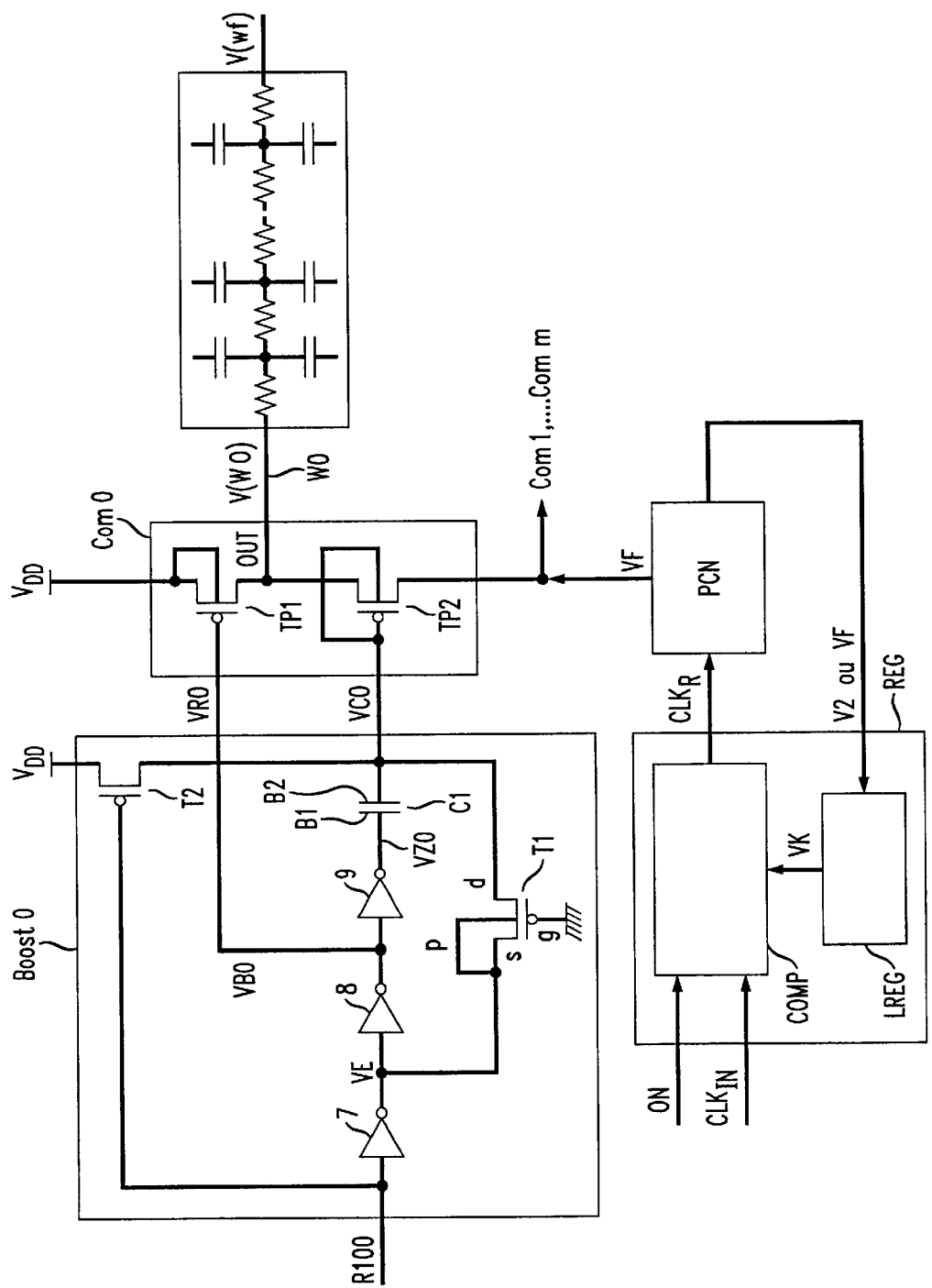
FIG. 6 is a more detailed drawing of the switching device, as well as a block diagram of a load pump device with a regulation circuit, according to the present invention.

The switching circuit and the switch control circuit are shown in detail in FIG. 6. The switching circuit Com0 in the example has two P-type transistors TP1 and TP2 series-connected between the supply voltage Vdd and the voltage signal VF. The source of the transistor TP1 is connected to Vdd. The drain of the transistor TP1 and the source of the transistor TP2 are connected together and form the output OUT of the switching circuit Com0. The output OUT is connected to the row of associated cells W0. The two P-type transistors are controlled in opposing phase to switch over either Vdd or VF to an output OUT.

The transistor TP2 enables the switching of the negative voltage VF applied to its drain. It is well known to one skilled in the art that a transistor cannot switch over a drain voltage that is more negative than its gate voltage. Hence, to switch over the maximum negative voltage, it is preferable to control the gate of the transistor TP2 by a voltage square wave that varies between the level Vdd and a negative level Vneg. The level Vneg will typically have a value ranging from −200 millivolts to −Vdd, which will enable compensation for at least a part of the loss of the threshold voltage.

The control circuit boost0 provides this voltage square wave at the gate input of the transistor TP2 of the associated switching circuit Com0. In the example, the control circuit boost0 also provides the control signal VR0 for the gate of the transistor TP1. This turns the transistor TP1 off before turning the transistor TP2 on. Thus, the voltage VF will find a smaller load at the output. The output node OUT of the switching circuit will therefore become charged at a higher speed.

In the example shown in FIG. 6, the switching control circuit boost0 has a capacitor C1 with a terminal B1 and a terminal B2, and a control circuit. The control circuit has a first inverter 7 to provide an input signal VE from the selection signal Rw0 of the row W0, as provided by the row decoder DECY (FIG. 5). The input signal VE is first applied to a circuit including two inverters 8 and 9 that are series-connected to transmit the low level of the input signal VE to the terminal B1 of the capacitor C1, with a certain delay Dt. It is furthermore applied to a P-type MOS transistor T1 having its gate g connected to ground, its source s and body p are connected together for receiving the input signal VE, and its drain d is connected to the terminal B2 of the capacitor. The transistor T1 enables the transmission of the low level of the input signal VE to the terminal B2, without any delay and by its parasitic bipolar transistor (not shown) which provides the capacitor a path of negative charges. The signals Rw0 and VE, as well as the signals VB0 at the output of the inverter 8 and VZ0 at the output of the inverter 9, are voltage square wave signals between Vdd and zero volt. A voltage square-wave signal VC0 between the level Vdd and the level Vneg is recovered at the output at the terminal B2 of the capacitor. The level Vneg may attain −Vdd depending on the dimensions chosen for the different elements of this circuit Boost0.

The following description referrs to the operation of the switching control circuit Boost0. The input signal VE is, in the example, inactive in the high state Vdd. VB0 and VC0 are then at the same high level Vdd. When a transition from Vdd to zero appears at the input signal VE, this transition is immediately transmitted to the second terminal B2 of the capacitor. This is done while the other terminal B1 of the capacitor, which is at VZ0, is still at the level Vdd. The transition from Vdd to zero corresponds to the selection of the row W0 (positive clock pulse on Rw0).

The charge from the terminal B2 of the capacitor flow to ground through the transistor T1. This is as a result of its parasitic bipolar transistor, which is highly conductive at this time. The signal VC0 decreases towards zero volts. When the low level of the input signal VE reaches the terminal B1, this has the effect of pushing the voltage of the terminal B2 to the negative voltages. When the signal VE returns to low level Vdd, the voltage of the terminal B2 returns to this same level Vdd. In the example, another transistor T2 is provided between Vdd and the terminal B2 controlled at its gate by the signal Rw0 to maintain the level Vdd at output when there are no square waves to be generated. It is the signal VB0 (the reverse of VE) that is used in the example to control the gate of the transistor TP1 of the switching circuit associated with the row Rw0. This signal is in opposing phase with VC0. This signal also provides that the transistor TP1 will be off before the change of Vdd to Vneg as the signal VC0 makes the transistor TP2 conductive.

Figure 7:
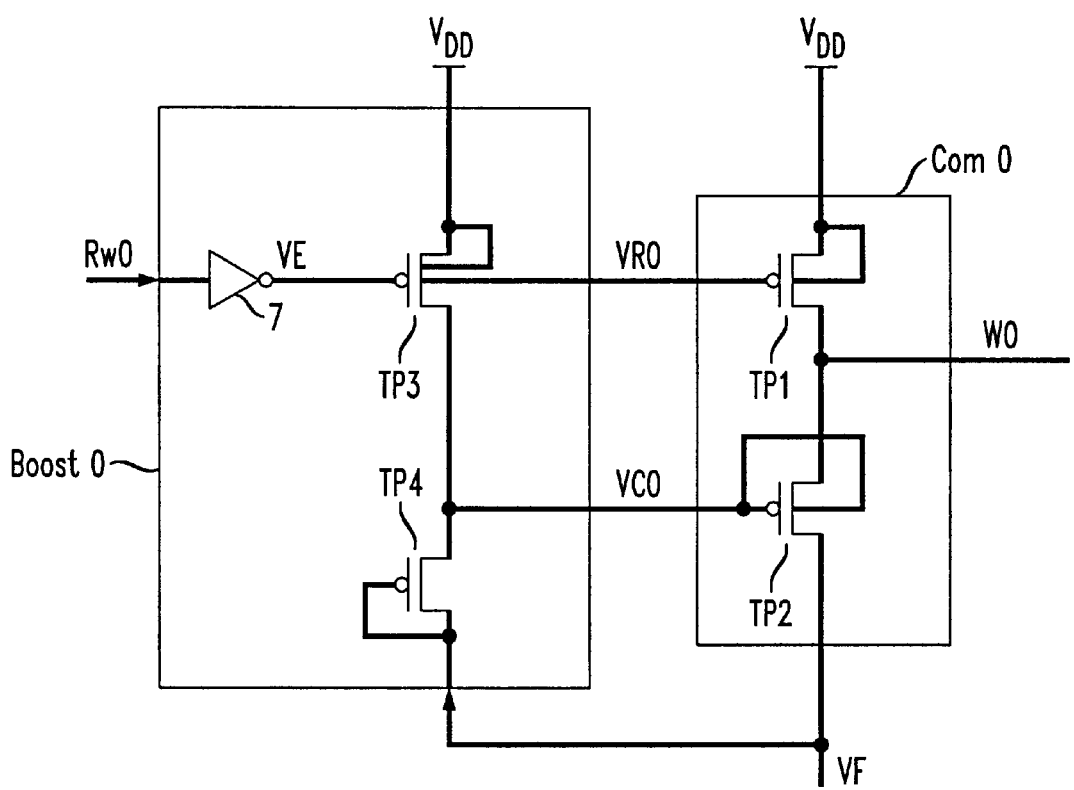
FIG. 7 shows an alternative embodiment of the negative voltage switching control, according to the present invention.

Another exemplary embodiment of the switching control circuit boost0 is shown in FIG. 7. This circuit uses a resistor to draw the potential of the gate of the transistor TP2 to the negative levels. The switching control circuit boost0 comprises the inverter 7 to provide the input signal VE from the signal Rw0 for the selection of the row W0. The switching control circuit boost0 also comprises two series-connected P-type MOS transistors TP3 and TP4. The transistor TP3 has its source and body connected to Vdd and its drain connected to the source of the transistor TP4. It is controlled at its gate by the signal VE. The signal VE is used as a control VR0 for the gate of the transistor TP1 of the switching circuit Com0. The transistor TP4 is mounted as a resistor with its gate connected to its drain, which is where the voltage VF is applied. When VE goes to 1 (Vdd), the transistor TP4 draws its source potential to VF which makes the transistor TP2 conductive.

With a system of this kind, it is possible to have a gate control level that is more negative (close to VF) than in the switching control circuit described in FIG. 6. It is therefore possible to switch the level VF-Vtp over to the row. However, there is permanent current consumption because of the resistor TP4. It is not possible to use a circuit of this kind when the voltage VF has to be applied in parallel to several switching circuits. Reference is made to the example shown in FIGS. 5 and 6. But it can be used when the voltage VF has to be applied only to a limited number of loads.

In practice, the device DPC does not have to permanently provide the voltage VF. All that it must do is to provide the low level (most negative level) when the application requires it, and to do so synchronously. This is the role of the external control signal ON generated by the row decoder DECY and applied to the device DPC. The signal VE of the switching control circuit boost0 could have been used as an external control signal. However, for the application that is being described herein, it is necessary to use a more general synchronous signal since the device DPC is common to all the switching circuits. The signal ON provided by the row decoder DECY is therefore more appropriate. This signal relates to the decoding of a group of rows. Thus, whenever a row of the memory is activated, the signal ON is activated forcing the operation of the pump, which can then be deactivated. with regard to the synchronization, the signal ON is such that the output signal VC0 of the control circuit boost0 applied to the gate of the transistor TP2 of the switching circuit goes to the negative level Vneg before the level VF is available. This reduces the capacitance seen from the pump and the switching control circuit Boost0.

In the invention, and as shown in FIG. 6, the negative load pump device DPC comprises a negative load pump circuit PCN associated with a regulation circuit REG according to the invention. The regulation circuit of the invention is designed to limit the power consumption of the pump by stopping it when the output voltage VF of the pump is not being used by the intended application. This is done under optimum stopping conditions. These optimum conditions correspond to a state of the pump in which its power consumption is the minimum, but makes it possible as soon as the pump is reactivated by an external command ON, to provide a speedy supply at the following change in phase of the clock signal CLKR of the low level (most negative level), which is expected of the output voltage VF of the pump. As previously stated, the most negative level of the signal VF is referred to as the low level and the least negative level is referred to as the high level.

The conditions of minimum power consumption are achieved when the voltage level of VF is closest to zero. This corresponds to its high level, and when it is in a phase close to the transition to its most negative level (low level). This ensures the conditions for the speedy supply of the expected low level for the intended application of the output voltage on the basis of the stopping conditions of the pump. The regulation circuit according to the invention can be used with a variety of negative load pumps, but is applicable to a negative load pump according to the invention.

The regulation circuit according to the invention comprises a comparison circuit COMP and a regulation logic circuit LREG. The logic circuit LREG has a function of providing the clock signal CLKr to the pump circuit PCN from the different signals received. These signals include an input signal CLKin of the DPC device, the external control signal ON, a comparison signal VK provided by the comparison circuit COMP and, a standby command signal, Sleep.

The comparison circuit COMP provides the logic circuit the comparison signal VK. This signal VK enables the logic circuit LREG to stop the pump when the stopping conditions are detected or to reactivate it if these conditions are no longer fulfilled. This is done until these conditions are detected again. The stopping of the pump is obtained by forcing the clock signal CLKr to a resting level dependent upon the logic circuit. The comparison circuit is designed to detect the stopping conditions of the pump, i.e., conditions of minimum power consumption and optimum restarting. It is not necessary to operate the pump when the output voltage VF is not used by the application. However, if the pump is stopped, there is a risk of having a high level of power consumption. Furthermore, it is possible to be far from the low voltage level VF expected at the output of the pump by the application. The voltage comparison circuit therefore enables a detection of the optimum stopping conditions to stop the pump in these stopping conditions and keep it stopped. The pump is stopped as long as no external command arrives or as long as the internal leakages do not modify this state.

Figure 10:
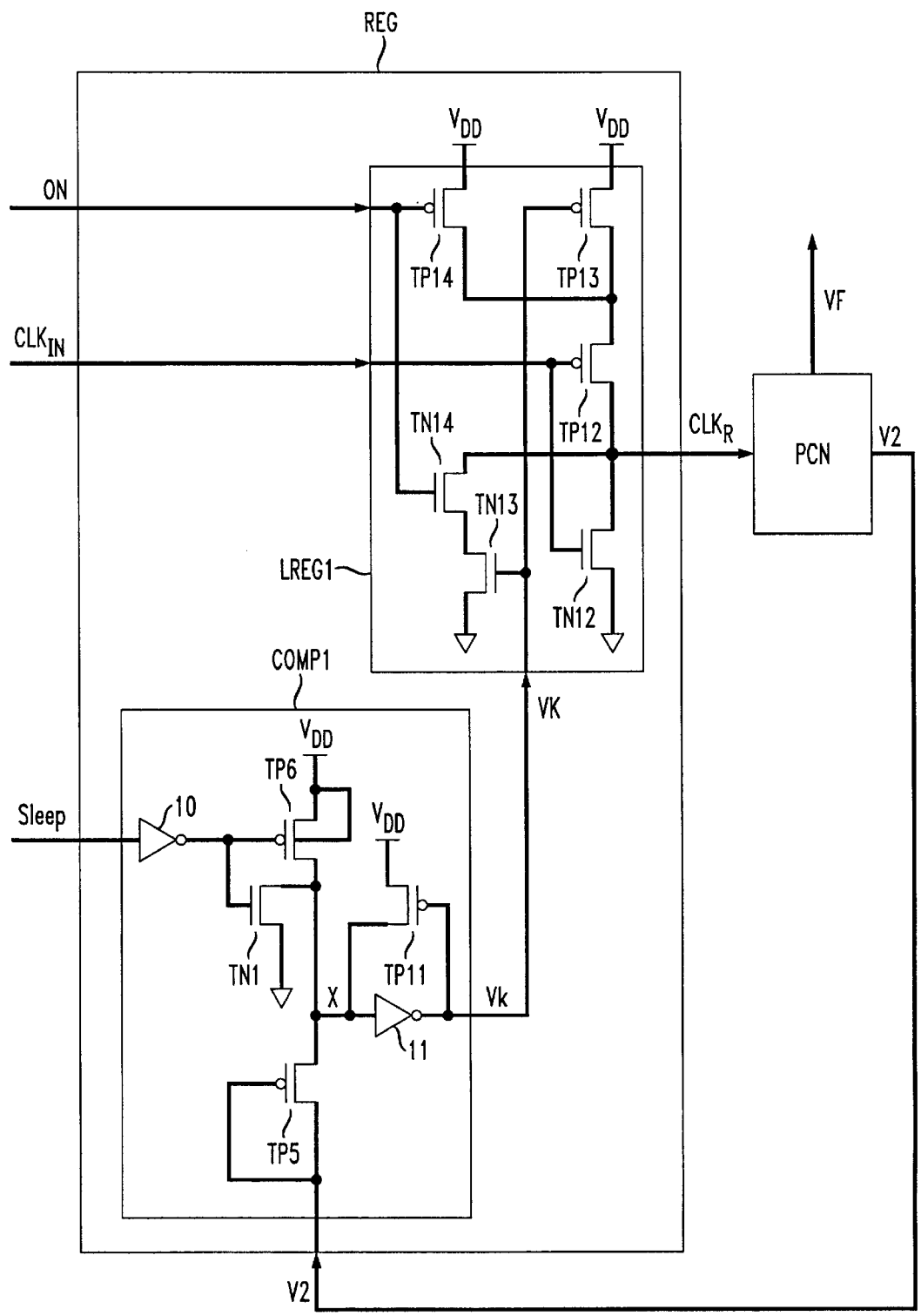
FIG. 10 is a detailed drawing of a first embodiment of a regulation circuit for a negative pump load device comprising more than one stage, according to the present invention.

FIG. 10 illustrates a first embodiment of a regulation circuit according to the invention. This embodiment corresponds to a first approach that detects the stopping conditions. For a clear understanding, reference will be made to the curves of FIG. 3. These curves relate more particularly to the output voltage of the next to the last stage V2 and the output voltage VF of the last stage. In this figure, it can be seen that the high level V2$h$ and the low level V2$b$ of the output voltage V2 are both negative, and respectively equal −0.5 volts and −1.3 volts. The high level VFh of the voltage VF is equal to −1 volt and the low level VFb is equal to −2 volts.

In this example, the pump consumes less power for the least negative level of the voltage VF, which is closest to zero, i.e., the level Vfh. For V2, this corresponds to the level V2$b$. Furthermore, starting from this state where the voltage V2 is at its most negative level V2$b$, the transition to the level V2$h$ at the next change in phase is obtained. This corresponds, for the output voltage VF, to the transition to its most negative level VFb. It will be noted that normally the low level V2$b$ of the output voltage V2 of the next to the last stage will probably be negative in steady operation. Thus, the first embodiment of the invention uses the voltage V2 of the next to the last stage of the pump to detect the stopping conditions according to the invention. This corresponds to the transition to the low level of the voltage V2. It is therefore applicable to a pump circuit comprising at least two stages. The regulation circuit must therefore monitor the output voltage level V2 of the next to the last stage to enable the logic circuit to stop the pump at the low level (most negative level) of this voltage V2.

In this first embodiment, the regulation circuit thus comprises a comparison circuit COMP1 and a regulation logic circuit LREG1. The comparison circuit COMP1 compares the level of the signal V2 with a reference threshold greater than the low level V2b of the signal V2. For example, if it is sought to stop the pump on a low level of V2 equal to −1.3 volts, as shown in FIG. 3, this reference threshold Vs will be in the range of −1.2 volts. As soon as the level V2 becomes more negative than −1.2 volts, the output of the comparison circuit switches over and controls the stopping of the pump. The pump is stopped as long as the level V2 is smaller than the reference threshold Vs. Under these stopping conditions, VF is at a high standby level, which is a level of about −1 volt in the example.

The reference threshold (or regulation threshold) is defined or specified to ensure that, upon the reactivation of the pump, the defined negative level VF expected by the application is obtained at the output. This is done at a following change in phase of the clock CLKr, with the defined negative level VF being obtained on the basis of the high standby level. In the example, the negative level expected is −2 volts. The pump used may be capable of providing an even more negative level at output, for example, a level of −2.5 volts. It is the threshold of the regulation according to the invention that makes it possible to adjust and ensure the low level will be provided at output, which is appropriate for the intended application.

As soon as the signal V2 becomes greater than the reference threshold Vs (due to leakage), the comparison circuit no longer detects the stopping conditions and the logic circuit will reactivate the pump to recover these conditions. Thus, as long as there is no external command, the regulation circuit maintains the stopping conditions on the pump. The pump is reactivated if necessary. The pump is thus regularly stopped and reactivated. This makes it possible to limit the power consumption of the pump. This is done while ensuring that the voltage level V2 at the next to the last output stage is always low enough to provide the stopping conditions and ensure the shortest possible starting time for the device. This is to have available the low level of VF expected at the output.

Figure 8:
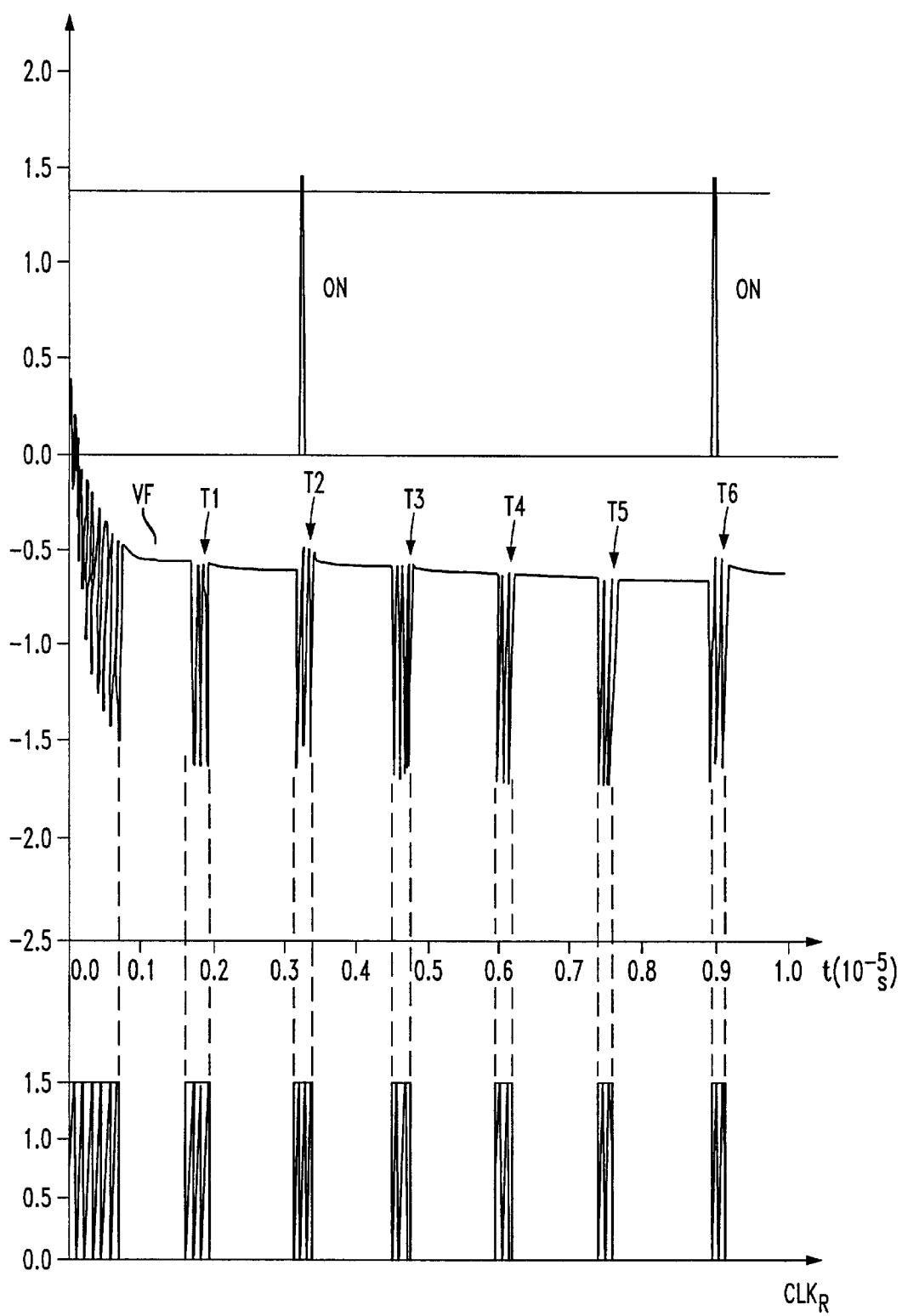
FIGS. 8 and 9 show the shape of the signals obtained with the device of FIG. 6.
Figure 9:
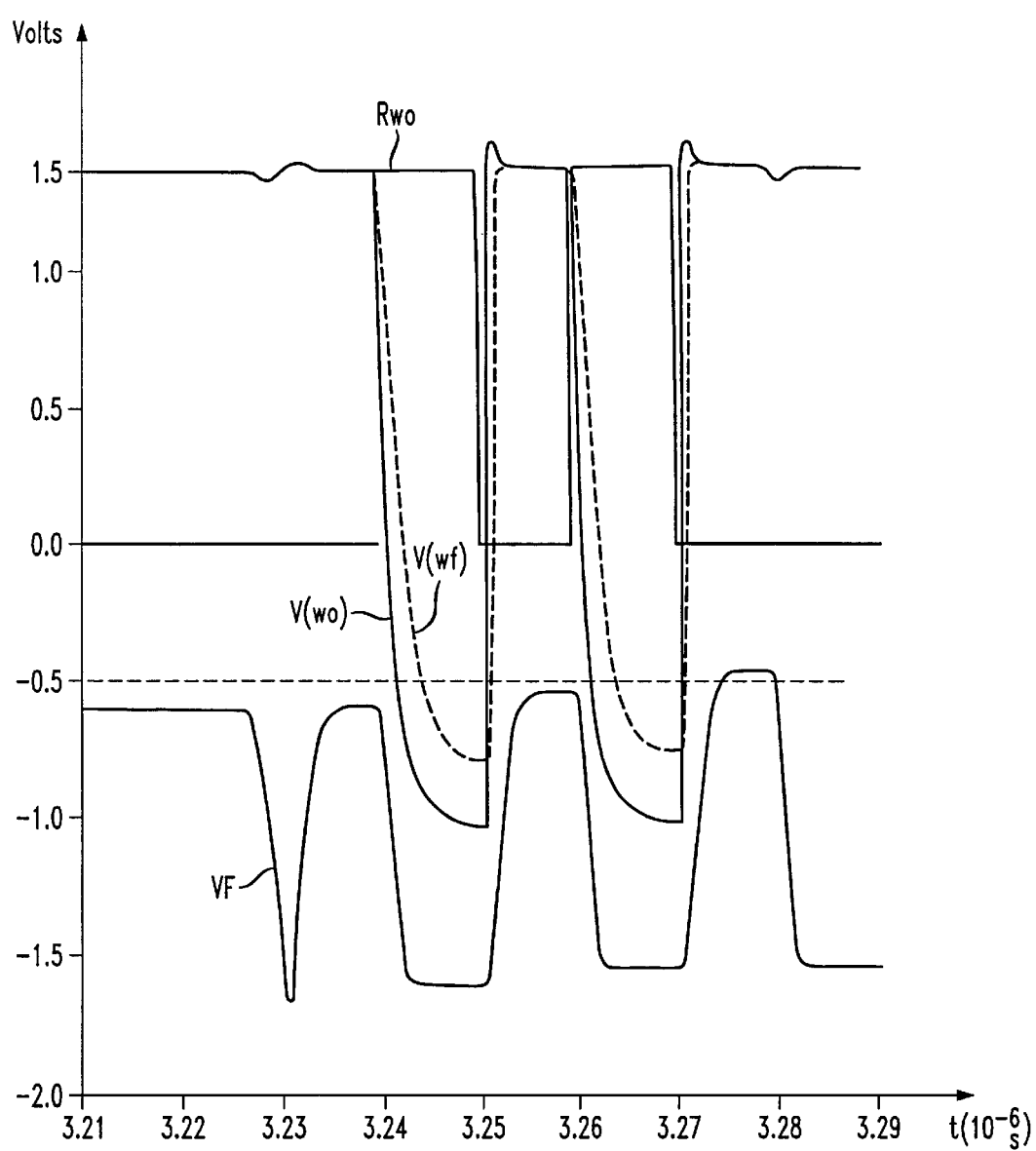

The operation of the load pump device DPC with a regulation circuit REG according to the invention is shown in FIGS. 8 and 9. FIG. 8 shows the regular reactivation of the pump to maintain the stopping conditions. These stopping conditions correspond to the high level of VF. When the device is started up, the clock signal CLKr is transmitted to the pump PCN as long as the level V2 does not negatively exceed the reference threshold Vs of the comparison circuit COMP1. When the level of V2 goes beyond this reference threshold Vs, the pump is stopped. At the points in time T1, T3, T4 and T5 in the figure, it is possible to see the reactivation of the pump maintains the level of the signal V2 below the reference threshold Vs. The pump is reactivated by the transmission of the clock signal CLKr. At T2 and T6, it is possible to see that the activation of the pump is responsive to an external command (signal ON).

In the example shown in this figure, the high level of the signal VF (with the pump stopped) is approximately located at −0.6 volts, and the low level (operating level) is at −1.5 volts. FIG. 8 also shows the signal V(W0) with a level that can be switched to a selected row W0 using the circuits Boost0 and Com0 of FIG. 6, as well as the shape V(Wf) of this signal. Referring to FIG. 6, this is done at the end of this row, where cells are charged in terms of equivalent resistance and capacitance. The use of a negative load pump device according to the invention, in combination with the decoder switching device, is highly efficient.

FIG. 9 illustrates a view of the regular supply of the low operating level of the voltage VF (−1.5 volts) after a starting phase. This is on the basis of a high resting level which is at approximately −0.6 volts, and is maintained by the regulation circuit according to the invention. FIG. 10 shows a detailed view of an exemplary embodiment of the comparison circuit COMP1 and of the logic circuit LREG1 in this first embodiment of a regulation circuit according to the invention. In this example, the circuit COMP1 comprises, at its input, a current regulation stage followed by a voltage conversion stage particularly suited for the detection of a negative reference threshold Vs.

The current regulation stage comprises a P-type MOS transistor TP6 mounted as a current generator series-connected with a transistor TP5 configured as a resistor. The transistor TP6 normally has its gate connected to the ground (zero volts) so that it is always on (saturated). In the example, it is controlled through an inverter 10 by a standby command signal Sleep. This signal is active at zero volts. Its purpose is to cut off all the functions of the circuit to prevent it from functioning and consuming power. The source of the transistor TP6 is connected to Vdd and its drain is connected to the source of the transistor TP5. The transistor TP5 has its gate connected to its drain (resistor), and its gate receives the output signal V2 of the next to the last stage of the pump PCN at the input.

The connection node X between the two transistors TP5 and TP6 is connected to the input of the voltage conversion stage. This conversion stage comprises an inverter 11 that provides the comparison signal VK at the output. The level of this comparison signal VK is either Vdd or zero. The comparator operates as follows. The signal V2 is applied to a low impedance input, i.e., the drain of the transistor TP5, of the current regulator formed by the transistors TP5 and TP6. The transistor TP6 which has its gate normally at zero volts is saturated and operates as a current generator. The value of the current in the regulation stage will depend on the transistor TP5 and on the level of the voltage V2 that is applied to its drain. Depending on whether the level of V2 is smaller than or greater than a reference threshold Vs, i.e. at a greater or smaller distance from zero, there will be a current variation that leads to the switch-over of the inverter. The reference threshold is adjusted by the ratio of the geometries W/L of the transistors TPS and TP6 and the threshold of the inverter.

This type of regulation makes it possible to optimize the output voltage of the pump as a function of the value of Vdd. The current in the transistor TP6 is a function of Vdd. It is possible to apply a standby command signal Sleep to the comparison circuit. To ensure this standby command, an N-type transistor TN1 is used. Its function is to force the node X to zero when the standby command is active (Sleep at 0). The gate of the transistor TN1 is connected to the gate of the transistor TP6, its drain is connected to the drain of the transistor TP6, and its source is connected to ground.

To improve the stability of the comparison circuit if the pump device should be turned off, it is possible to provide for a loop using a P-type MOS transistor TP11 between the output and the input of the inverter 11. However, this is not necessary because when the pump is turned off, the potential V2 tends to become more negative. This provides a stable state at the output. When the level of V2 becomes more negative, i.e., smaller than the reference threshold Vs (low level of V2), the node X is drawn to zero (TP5 conducts more current) and VK goes to Vdd. This has the effect of stopping the pump. If V2 becomes less negative, the node X goes up to Vdd (TP5 is less conductive), and VK goes to zero. This has the effect of reactivating the pump. If the standby command (Sleep) is activated, the current generator TP6 is off and the transistor TN1 forces the node X to zero. The comparison signal VK is thus forced to Vdd. This causes the pump to stop as long as the standby command Sleep is active.

The regulation logic circuit LREG1 therefore receives the clock signal CLKin as well as the output signal VK from the comparison circuit and the external control signal ON. The function of the logic circuit is to enforce the activation of the pump when the signal ON is active. The negative signal VF has to be supplied to an application. Such an application includes the switching circuits Com0, . . . , Comm switching to a row of the memory shown in FIG. 6. This function is a priority that is independent of the state of the comparison signal VK. When the signal ON is not active (at the resting level Vdd), the logic circuit must cut off the clock to the pump or validate it depending on the level of the comparison signal VK.

This function of the logic circuit LREG1 may be achieved in different ways. One exemplary way is shown in FIG. 10. In this example, the signal CLKin is applied as an input to a CMOS inverter with a P-type transistor TP12 and an N-type transistor TN12 whose output provides a reverse clock signal CLKr. This signal is the clock signal applied to the load pump PCN. The source of the transistor TN12 is at ground while the source of the transistor TP12 is connected to the drain of a first P-type transistor TP13 and a second P-type transistor TP14 whose sources are at Vdd. The first transistor TP8 has its gate controlled by the signal VK. The second transistor TP14 has its gate controlled by the signal ON. The output of the inverter TP12, TN12 is connected to a series assembly of two N-type transistors TN13 and TN14. The transistor TN14 is connected between the output of this inverter and the drain of the transistor TN13 whose source is grounded. The gate of the transistor TN14 is controlled by the signal ON while the gate of the transistor TN13 is controlled by the signal VK.

If the signal ON is not active (ON=Vdd, TP14 off and TN14 on), it is the level of the comparison signal VK that determines whether the reverse of the signal CLKin is transmitted (VK=0, TP13 on and TN13 off) or whether the output CLKr of the inverter is set at zero (VK=Vdd, TP13 off and TN13 on). As soon as the external control signal ON goes to zero, it is this signal that predominates and dictates the (reverse) transmission of the clock signal (TP14 on, TN14 off). Thus, the signal ON validates the transmission of the clock signal CLKin and the most negative level (VFb) of VF is provided at high speed.

Figure 11:
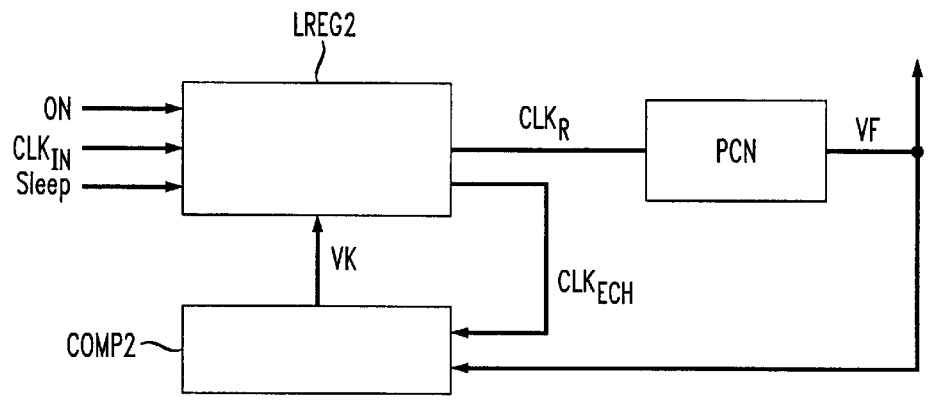
FIG. 11 is a block diagram of a regulation circuit according to a second embodiment of the present invention.

FIG. 11 shows the load pump device with a regulation circuit in an alternative embodiment of the invention. This is applicable to the case where the load pump circuit PCN has only one stage, as illustrated in FIG. 1. In this case, there is no next to the last stage to provide the signal V2 which would be used to detect the stopping conditions of the pump. It is therefore necessary to use the single signal available at the output, i.e., the signal VF.

In this case, the detection of the stopping conditions is slightly different. The minimum power consumption is still obtained at the high level of the signal VF. It should also be possible thereafter to speedily provide the expected low level of the signal VF upon the external command ON. It is therefore necessary to analyze whether the voltage VF is sufficiently low, i.e., below a reference threshold Vs. But it is also necessary to take account of the detection only in the operating phase of the pump where the signal VF is at its high level. For these reasons, the comparison circuit comprises a stage to sample the output of the stage for detecting the reference threshold Vs.

Furthermore, for the example of a single-stage pump circuit, the high level of the signal VF corresponding to the stopping conditions is a positive level. The pump circuit obtains a signal VF corresponding to the signal V1 shown in FIG. 3, with a high level of +200 millivolts approximately and a low level of –0.6 volts. The reference threshold in this case is positive, in the range of 195 millivolts, for example. If the pump is started, and if the system passes to the positive high level, the stopping conditions will be detected and the pump will be stopped. In this case it will remain permanently stopped. Since the signal VF has not gone to a negative level before detection, the capacitor (C10, FIG. 1) has never been charged. Hence, the comparison circuit of this second embodiment furthermore comprises a starting circuit that invalidates the detection as long as the signal VF has not transitioned to a negative level. As soon as it has gone to a negative level, the starting circuit validates the detection.

The regulation circuit thus comprises a logic circuit LREG2 and a comparison circuit COMP2. At the input, the logic circuit LREG2 receives the external control signal ON, the clock signal CLKin, the comparison signal VK, and the standby command signal Sleep. At output, it delivers the clock signal CLKr to the negative load pump PCN, and a sampling clock signal CLKech to the comparison circuit COMP2. At the input, the comparison circuit COMP2 receives the sampling clock signal CLKech, the standby command signal Sleep, and the output signal VF from the last stage of the negative load pump PCN. At the output, it delivers the comparison circuit VK.

Figure 12:
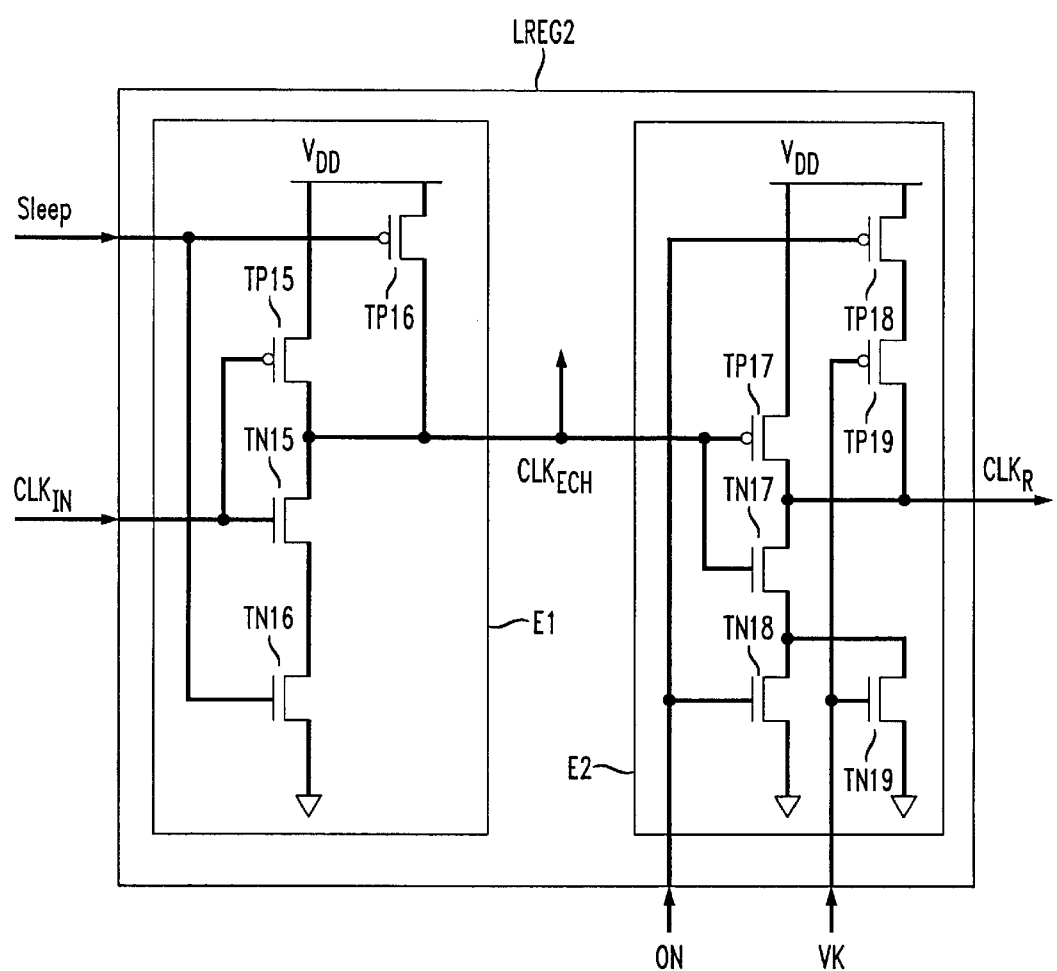
FIG. 12 is a detailed drawing of a corresponding regulation logic circuit, according to the present invention.

FIG. 12 is a detailed drawing of the logic circuit LREG2. It comprises a first stage E1 that provides the sampling clock signal CLKech at the output from the input clock signal CLKin and the standby command signal Sleep. The function of this stage is to carry out the transmission of the reverse of the input clock signal when the standby command signal Sleep is not activated. The transmission is at the output CLKech. The function of this stage is to set the output CLKech at Vdd in the example when the standby command signal Sleep is activated.

For this purpose, the input stage E1 comprises a CMOS inverter formed by a P-type transistor TP15 and an N-type transistor TN15 whose input receives the input clock signal CLKin and whose output provides the sampling clock signal CLKech. The stage E1 furthermore comprises a P-type transistor TP16 and an N-type transistor TN16 each receiving the standby command signal Sleep at its gate. The transistor TP16 is connected between Vdd and the output of the inverter formed by the transistors TP15 and TN15. The transistor TN16 is also connected between the drain of the transistor TN15 and ground Gnd. Thus, when the standby command signal is activated (Sleep at zero), the transistor TP16 conducts and the transistor TN16 is not conducting. This sets the output CLKech of the inverter at Vdd. When this is not the case, the output CLKech is equal to the reverse of the input clock signal CLKin.

The regulation logic circuit comprises a second stage E2 to provide at the output the clock signal CLKr. This signal is applied to the pump PCN from the sampling clock signal CLKech, the external control signal ON, and the comparison signal VK. The same function as that of the regulation logic circuit of FIG. 10 is seen here again.

When the external control signal ON is activated (at 1 in the example) and regardless the state of the comparison signal VK (0 or 1), transmission on the clock signal CLKr of the reverse of the sampling clock signal CLKech must be performed. When the external control signal ON is inactive (at 0 in the example), the reverse of the clock signal CLKech has to be transmitted on the clock signal CLKr. This has to be done if the pump is not in the optimum conditions (VK at 1), or the signal CLKr has to be set at zero to stop the pump when it is in the optimum conditions (VK at 0). For this purpose, the stage E2 comprises a CMOS inverter with a P-type transistor TP17 and an N-type transistor TN17 whose input receives the signal CLKech and whose output provides the signal CLKr.

A transistor TP18 and a transistor TP19 are series-connected between Vdd and the output of the inverter (TP14, TN14). The source of the transistor TP18 is connected to Vdd and the drain of the transistor TP19 is connected to the output of the inverter. The transistor TN18 and the transistor TN19 are each parallel-connected between the source of the transistor TN17 and ground. The two transistors TN18 and TP18 have their gate controlled by the external control signal ON. The two transistors TN19 and TP19 have their gate controlled by the comparison signal VK. When the signal ON is activated, the signal CLKech is transmitted (in reverse at output) regardless of the level of the comparison signal VK. When the signal ON is inactive (1), the comparison signal VK must be at Vdd to enable this transmission. If the comparison signal VK is at zero, the output CLKr is set at Vdd by the transistor TP19. The transistor TN19 is off, which prevents the inverter from working.

Figure 13:
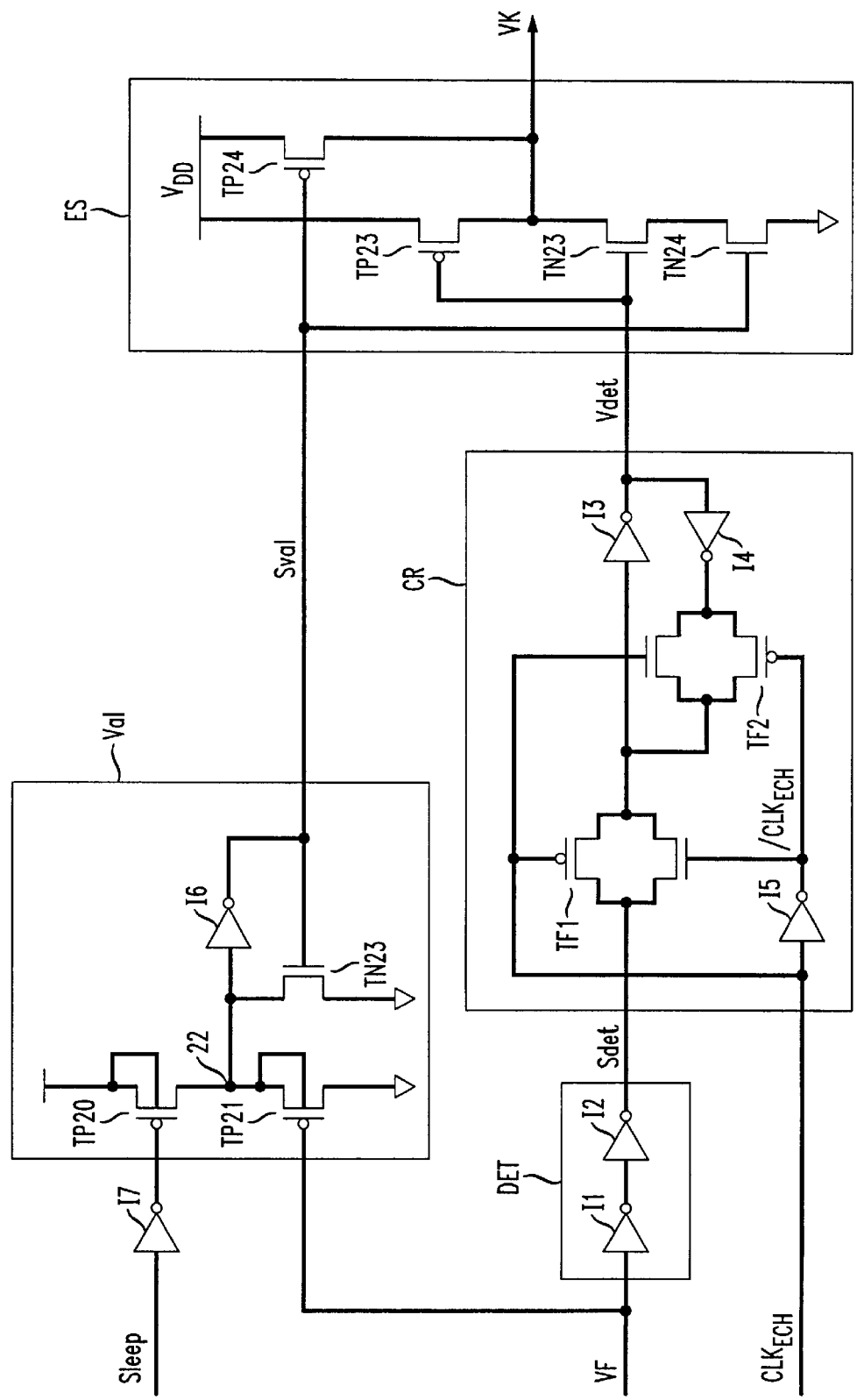
FIG. 13 is a detailed drawing of a corresponding comparison circuit, according to the present invention.

FIG. 13 is a detailed diagram of a comparison circuit according to the second mode of regulation according to the invention. This second mode of regulation detects whether the stopping conditions of the pump have been attained by monitoring the level of the output signal VF from the pump. FIG. 13 shows the signals CLKr, CLKech and VF. The stopping conditions correspond to the high level VFh of the output signal VF. As discussed above, the comparison circuit comprises two stages in this case. A detection stage DET detects whether the level of the signal VF is below a reference threshold Vs. A sampling stage CR takes account of the detection only in the phase corresponding to the high level of VF to enable the fastest supply of the most negative level (low level VFb) of VF on the basis of the stopping conditions of the pump.

Finally, it has been seen that, in the example taken for a signal VF oscillating between a positive high level VFh of +200 millivolts and a negative low level VFb of −1 volt, it is necessary to have a positive reference threshold detection circuit associated with a starting circuit VAL. The oscillating signal corresponds to a single-stage pump circuit. It is possible to validate the detection only when the signal VF has become negative.

The comparison circuit described in detail in FIG. 13 shows an exemplary embodiment of these different circuits. The detection circuit DET typically comprises two inverters I1 and I2 whose geometrical ratios W/L are determined to obtain the positive reference threshold VS to be detected. At the input, the signal VF is received and, at the output, a detection signal Sdet is provided. When the level of the signal VF is below the reference threshold Vs, the output Sdet goes to its active level 1, which is Vdd in the example. The reference signal corresponds to the stopping conditions to be detected (the high level of VF). This detection signal is applied to a sampling circuit CR which, in this example, is formed by a latch type register cell. This cell is controlled by the sampling clock signal CLKech. The transition of CLKech from the 0 state to the 1 state, which corresponds to the operating phase of the pump in which the signal VF goes to its high level, causes the storage of the state of the signal Sdet at this point. This also causes the transmission, at the output, of Vdet which is the reverse of this state. The register cell typically comprises a first transfer gate TF1 at the input, followed by two inverters I3 and I4 looped by a second transfer gate TF2. The two gates are controlled in phase opposition by the signal CLKech and its reverse/CLKech provided by the inverter I5.

In the case of a positive reference threshold, it is necessary to associate a starting stage VAL with the detection stage. The output SVAL of this starting stage VAL is used to validate or not validate the transfer (in reverse) of the signal Vdet to the comparison output VK in an output stage ES. In the example, the starting stage VAL has two P-type transistors TP20 and TP21 series-connected between Vdd and ground Gnd. The source of the transistor TP20 is at Vdd and the drain of the transistor TP21 is at ground. The gate of the transistor TP21 is controlled by the signal VF. The connection point 22 between the two transistors is applied to the input of an inverter I6 whose output provides the validation signal SVAL. This output SVAL is looped to the input of the inverter I6 by an N-type transistor TN13, which is controlled at its gate by the signal SVAL to keep the input of the inverter at zero when the output signal has gone to 1.

This starting stage works as follows. The transistor TP20 is normally always on. As long as the signal VF is positive or zero or is not sufficiently negative, the transistor TP21 is not conductive (VF>0), or is so slightly conductive so that the potential of the midpoint is imposed by the transistor TP20 at Vdd. The output SVAL in this case is at zero. This invalidates the detection in the output stage. As soon as the signal VF becomes sufficiently negative, the transistor TP21 will draw more current and draw the node 22 to ground. The output of the inverter switches over to 1. This state is sustained by the turning on of the transistor TN13. The transistor TN13 then keeps the input of the inverter at zero. The subsequent progress of the signal VF is no longer of any importance. The signal SVAL is permanently at 1.

The output stage ES which enables the invalidation or validation of the detection comprises a CMOS inverter formed by a P-type transistor TP23 and an N-type transistor TN23. The N-type transistor TN23 receives the signal Vdet at the input and provides the comparison signal VK at the output. The transistor TP23 has its source connected to Vdd, while the source of the transistor TN23 is connected to ground Gnd by an N-type transistor TN24. A transistor TP24 is furthermore connected between Vdd and the output VK of the inverter. The two transistors TP24 and TN24 are controlled by the validation signal SVAL. Thus, as long as the signal SVAL is at zero, the output VK is set at 1. As soon as the signal SVAL goes to 1, the inverter works normally. The result of the sampled detection Vdet is transmitted (in reverse) to VK.

As previously stated, the second embodiment of the regulation circuit according to the invention based on the detection of the level of the signal VF itself was applicable to all the negative load pumps comprising one or more stages. Should the pump comprise several stages, such as two or three stages, the high level of the signal VF will probably be negative. Then, the detection stage DET will be adapted to the detection of a negative threshold. It is possible, for example, to use the low impedance detection circuit COMP1 of FIG. 10. There will be no need for a starting stage VAL. The output stage will be adapted to the circuits and to the logic levels of the signals obtained. Those skilled in the art will be capable of using other detection circuits to implement the invention, and that the invention is not limited to the circuits described. To prevent the power consumption of the comparison circuit COMP2 in the embodiment of FIG. 13, it is sufficient to apply a standby command signal Sleep to the gate of the transistor TP20 through an inverter I7. Thus, there is no power consumption in this connection path and the output stage is off. Should a detector be used for a negative reference threshold, it is possible to use the circuit COMP1 with the standby command described with reference to FIG. 10.

The invention that has just been described provides a very efficient negative load pump device that is capable, through the pump structure of the invention, of providing a stable negative level ranging from several hundreds of millivolts to a few volts using a low supply voltage. The combination of a negative load pump device with a regulation circuit according to the invention provides a guaranteed output negative low level, optimum power consumption, and efficient response time.

The regulation circuit according to the invention can be used with any negative load pump of the prior art. All that is required is to adapt the reference threshold (or regulation threshold) to be detected according to the characteristics of the output signal VF or the signal V2 of the next to the last stage of the pump used and according to the intended application. Depending on whether the threshold to be detected is positive or negative, it is possible to use either of the comparison circuits described in the present invention or any other detection circuits known to those skilled in the art. In general, the present invention is not limited to the exemplary embodiments described. Those skilled in the art will be capable of using or adapting other circuits to implement the present invention.

That which is claimed is:

1. An integrated circuit comprising:
   a negative load pump comprising n stages, n being equal to or greater than one, each stage comprising
   a switching MOS transistor being formed in a well and having a gate, a source, a drain and a body, the body, the gate and the source connected in common for receiving a first phase signal, and
   a capacitor comprising a MOS transistor being formed in a well and having a gate, a source, a drain and a body, the gate defining a first terminal, and the source, the drain and the body connected together to define a second terminal for receiving a second phase signal, and the drain of said switching MOS transistor is connected to the first terminal of said capacitor.

2. An integrated circuit according to claim 1, wherein said negative load pump comprises a single stage, said negative load pump further comprising:
   an input for receiving an input clock signal; and
   a first inverter and a second inverter series-connected to respectively provide the first phase signal and the second phase signal from the input clock signal, an output of said negative load pump being provided by the first terminal of said capacitor.

3. An integrated circuit according to claim 1, wherein said negative load pump further comprising:
   an input for receiving a clock signal;
   a first inverter and a second inverter series-connected to respectively provide the first phase signal and the second phase signal from the input clock signal; and
   wherein said negative load pump comprises n stages, n being equal to or greater than two, the first phase signal being applied to the gate of said switching MOS transistor of a first stage and to a second terminal of said capacitors of even-order stages, the second phase signal being applied to a second terminal of said capacitors of odd-order stages, and the gates of said switching MOS transistors of the other stages being controlled by a phase signal provided by the first terminal of said capacitor of a previous stage, an output of said negative load pump being provided by the first terminal of said capacitor of a last stage.

4. An integrated circuit according to claim 1, wherein the gate of said switching MOS transistor is to receive a square wave voltage between a level of a supply voltage and a level of negative voltage, and an output voltage of said negative load pump being applied to the drain of said switching MOS transistor to switch over a low level of the output voltage delivered by said negative load pump to a load line.

5. An integrated circuit according to claim 1, further comprising a regulation circuit for regulating an output voltage provided by said negative load pump, the output voltage oscillates between a more negative low level and a less negative high level, said regulation circuit comprising:
   a detection circuit for detecting stop conditions of said negative load pump corresponding to a minimum power consumption of said negative load pump, and for providing a supply of the more negative low level of the output voltage responsive to the stop conditions; and
   a logic circuit to stop said negative load pump as long as the stop conditions are detected.

6. An integrated circuit according to claim 5, wherein said negative load pump comprises n stages, n being equal to or greater than two, and wherein said detection circuit comprises
   a comparison circuit having a stage for detecting a reference threshold and for receiving an output signal from a stage next to a last stage of said negative load pump, said comparison circuit delivering a comparison signal having an active level indicating that the output signal from the stage next to the last stage of said negative load pump is smaller than the reference threshold.

7. An integrated circuit according to claim 5, wherein said detection circuit comprises a comparison circuit comprising:
   a detection stage for detection of a reference threshold, said comparison circuit having an input for receiving the output signal from said negative load pump, and for delivering a detection signal at an output, and an active level of the detection signal indicates that the output signal is lower than the reference threshold; and
   a sampling stage having an input for receiving the output detection signal responsive to a detection only in a phase of operation of said negative load pump in which the output signal is at a high level, said sampling stage delivering a sampled detection signal at an output.

8. An integrated circuit according to claim 7, wherein the less negative high level of the output voltage is positive, said comparison circuit further comprising:
   a starting stage having an input for receiving the output voltage from said negative load pump, and for delivering a validation signal at an output to prevent transmission of the sampled detection signal to said logic circuit as long as the output voltage has not transitioned to a negative level.

9. An integrated circuit according to claim 5, wherein said regulation circuit comprises:
   at least one input for receiving a comparison signal, an input clock signal, and an external control signal, with activation of the external control signal being responsive to detection or non-detection of the stopped conditions;

an output for providing an output clock signal for said negative load pump, the output clock signal being transmitted responsive to an activated external control signal; and wherein said regulation circuit enables the more negative low level of the output voltage to be provided to an output, and a transmission of the output clock signal is responsive to a deactivated external control signal.

10. An integrated circuit according to claim 5, wherein said logic circuit comprises an input for receiving a standby command; and wherein said detection circuit comprises an input for receiving the standby command to set the comparison signal and the input clock signal of said negative load pump in a specified state to prevent said negative load pump and said detection circuit from consuming power.

11. A regulation circuit for regulating an output voltage provided by a negative load pump, the output voltage oscillates between a more negative low level and a less negative high level, the regulation circuit comprising:

a detection circuit for detecting stop conditions of the negative load pump corresponding to a minimum power consumption of the negative load pump, and for providing a supply of the more negative low level of the output voltage responsive to the stop conditions; and a logic circuit to stop the negative load pump as long as the stop conditions are detected.

12. A regulation circuit according to claim 11, wherein the negative load pump comprises n stages, n being equal to or greater than two, each stage comprising a capacitor and a switching MOS transistor having a drain being connected to a first terminal of said capacitor; and wherein said detection circuit comprises a comparison circuit having a stage for detecting a reference threshold and for receiving an output signal from a stage next to a last stage of the negative load pump, said comparison circuit delivering a comparison signal having an active level indicating that the output signal from the stage next to the last stage of the negative load pump is smaller than the reference threshold.

13. A regulation circuit according to claim 11, wherein the negative load pump comprises n stages, n being equal to or greater than one, each stage comprising a capacitor and a switching MOS transistor with the drain being connected to a first terminal of said capacitor; and wherein said detection circuit comprises a comparison circuit comprising:

a detection stage for detection of a reference threshold, said comparison circuit having an input for receiving the output signal from the negative load pump, and for delivering a detection signal at an output, and an active level of the detection signal indicates that the output signal is lower than the reference threshold; and a sampling stage having an input for receiving the output detection signal responsive to a detection only in a phase of operation of the negative load pump in which the output signal is at a high level, said sampling stage delivering a sampled detection signal at an output.

14. A regulation circuit according to claim 13, wherein the less negative high level of the output voltage is positive, said comparison circuit further comprising:

a starting stage having an input for receiving the output voltage from the negative load pump, and for delivering a validation signal at an output to prevent transmission of the sampled detection signal to said logic circuit as long as the output voltage has not transitioned to a negative level.

15. A regulation circuit according to claim 11, wherein said regulation circuit comprises:

at least one input for receiving a comparison signal, an input clock signal, and an external control signal, with activation of the external control signal being responsive to detection or non-detection of the stopped conditions;

an output for providing an output clock signal for the negative load pump, the output clock signal being transmitted responsive to an activated external control signal; and circuit for enabling the more negative low level of the output voltage to be provided to an output, and a transmission of the output clock signal is responsive to a deactivated external control signal.

16. A regulation circuit according to claim 11, wherein said logic circuit comprises an input for receiving a standby command; and wherein said detection circuit comprises an input for receiving the standby command to set the comparison signal and the input clock signal of the negative load pump in a specified state to prevent the negative load pump and said detection circuit from consuming power.

17. An integrated circuit comprising:

a negative load pump comprising n stages, n being equal to or greater than one, each stage comprising a switching MOS transistor being formed in a well and having a gate, a source, a drain and a body, the body, the gate and the source connected in common for receiving a first phase signal, and a capacitor comprising a MOS transistor being formed in a well and having a gate, a source, a drain and a body, the gate defining a first terminal, and the source, the drain and the body connected together to define a second terminal for receiving a second phase signal, and the drain of said switching MOS transistor is connected to the first terminal of said capacitor; and a regulation circuit for regulating an output voltage provided by said negative load pump, the output voltage oscillates between a more negative low level and a less negative high level.

18. An integrated circuit according to claim 11, wherein said regulation circuit comprises:

a detection circuit for detecting stop conditions of said negative load pump corresponding to a minimum power consumption of said negative load pump, and for providing a supply of the more negative low level of the output voltage responsive to the stop conditions; and a logic circuit to stop said negative load pump as long as the stop conditions are detected.

19. An integrated circuit according to claim 17, wherein said negative load pump comprises a single stage, said negative load pump further comprising:

a first inverter and a second inverter series-connected to respectively provide a first phase signal and a second phase signal from an input clock signal, an output of said negative load pump being provided by the first terminal of said capacitor.

20. An integrated circuit according to claim 17, wherein said negative load pump further comprising:

an input for receiving a clock signal;

a first inverter and a second inverter series-connected to respectively provide a first phase signal and a second phase signal from the clock signal; and wherein n is equal to or greater than two, the first phase signal being applied to the gate of said switching MOS transistor of a first stage and to a second terminal of said capacitors of even-order stages, the second phase signal being applied to a second terminal of said capacitors of odd-order stages, and the gates of said switching MOS transistors of the other stages being controlled by a phase signal provided by the first terminal of said capacitor of a previous stage, an output of said negative load pump being provided by the first terminal of said capacitor of a last stage.

21. An integrated circuit according to claim 17, wherein the gate of said switching MOS transistor is to receive a square wave voltage between a level of a supply voltage and a level of negative voltage, and an output voltage of said negative load pump being applied to the drain of said switching MOS transistor to switch over a low level of the output voltage delivered by the negative load pump to a load line.

22. An integrated circuit according to claim 18, wherein n is equal to or greater than two, and said detection circuit comprises a comparison circuit having a stage for detection of a reference threshold and for receiving an output signal from a stage next to a last stage of said negative load pump, said comparison circuit delivering a comparison signal having an active level indicating that the output signal from the stage next to the last stage of said negative load pump is smaller than the reference threshold.

23. An integrated circuit according to claim 18, wherein said detection circuit comprises a comparison circuit comprising:
   a detection stage for detection of a reference threshold, said comparison circuit having an input for receiving the output signal from said negative load pump, and for delivering a detection signal at an output, and an active level of the detection signal indicates that the output signal is lower than the reference threshold; and
   a sampling stage having an input for receiving the output detection signal to take account of a detection only in a phase of operation of said negative load pump in which the output signal is at a high level, said sampling stage delivering a sampled detection signal at an output.

24. An integrated circuit according to claim 23, wherein the less negative high level of the output voltage is positive, said comparison circuit further comprising:
   a starting stage having an input for receiving the output voltage from said negative load pump, and for delivering a validation signal at an output to prevent transmission of the sampled detection signal to said logic circuit as long as the output voltage has not transitioned to a negative level.

25. An integrated circuit according to claim 17, wherein said regulation circuit comprises:
   at least one input for receiving a comparison signal, an input clock signal, and an external control signal;
   an output for providing an output clock signal for said negative load pump, the output clock signal being transmitted responsive to the external control signal being active; and
   wherein said regulation circuit enables the more negative low level of the output voltage to be provided to an output, and a transmission of the output clock signal being responsive to the external control signal being inactive.

26. An integrated circuit according to claim 25, wherein said logic circuit comprises an input for receiving a standby command; and wherein said detection circuit comprises an input for receiving the standby command to set the comparison signal and the input clock signal of said negative load pump in a specified state to prevent said negative load pump and said detection circuit from consuming power.

27. A method for generating a negative voltage level for an integrated circuit, the method comprising the steps of:
   receiving an input signal;
   generating a first and a second phase signal based upon the input signal;
   providing the first phase signal to a gate of a switching transistor, the switching transistor formed in a well and having a source, a drain and a body, the body, the gate and the source connected in common for receiving the as first phase signal; and
   providing the second phase signal to a second terminal of a capacitor, the output negative voltage level being provided by a first terminal of the capacitor.

28. A method according to claim 27, further comprising the step of regulating the output negative voltage level, wherein the output negative voltage level oscillates between a more negative low level and a less negative high level.

29. A method according to claim 28, further comprising the steps of:
   detecting stop conditions of the negative load pump corresponding to a minimum power consumption of the negative load pump;
   providing a supply of the more negative low level of the output voltage responsive to the stop conditions; and
   stopping the negative load pump as long as the stop conditions are detected.

30. A method according to claim 27, wherein the capacitor comprises a MOS transistor formed in a well and having a gate, a source, a drain and a body, the gate defining a first terminal and the source, the drain and the body connected together for defining a second terminal.

31. A method according to claim 27, wherein the step of generating the first phase signal comprises the step of inverting the input signal.

32. A method according to claim 31, wherein the step of generating the second phase signal comprises the step of inverting the first phase signal.

33. A method according to claim 27, wherein the input signal comprises a clock signal.

* * * * *

UNITED STATES PATENT AND TRADEMARK OFFICE
CERTIFICATE OF CORRECTION

PATENT NO. : 6,239,651 B1  
DATED : May 29, 2001  
INVENTOR(S) : Richard Fournel It is certified that error appears in the above-identified patent and that said Letters Patent is hereby corrected as shown below:

Column 5,
Line 18, delete "negative level at" insert -- negative level at the --

Column 8,
Line 38, delete "referrs" insert -- refers --

Column 9,
Lines 2, 5, 32 and 43, delete "boost0" insert -- Boost0 --

Column 10,
Line 15, delete "logic circuit" insert -- logic circuit to --

Column 12,
Line 44, delete "TPS" insert -- TP5 --

Column 20,
Line 15, delete "circuit for enabling" insert -- a circuit for enabling --
Line 45, delete "claim 11," insert -- claim 17, --

Column 22,
Line 26, delete "as first phase" insert -- first phase --

Signed and Sealed this

Eighteenth Day of June, 2002

*Attest:*

*Attesting Officer*

JAMES E. ROGAN
*Director of the United States Patent and Trademark Office*